(12) United States Patent
Oshima et al.

(10) Patent No.: US 7,605,677 B2
(45) Date of Patent: Oct. 20, 2009

(54) NOISE FILTER HAVING FILTER COMPONENTS FITTED INTO DEPRESSIONS IN A BASE MEMBER

(75) Inventors: Hisato Oshima, Fukui (JP); Takaaki Ooi, Nagaokakyo (JP); Yoshimi Tanaka, Nagaokakyo (JP); Toshinori Murakami, Fukui (JP); Koji Yokoo, Echizen (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/768,301

(22) Filed: Jun. 26, 2007

(65) Prior Publication Data

US 2008/0122556 A1     May 29, 2008

Related U.S. Application Data

(63) Continuation of application No. PCT/JP2005/023744, filed on Dec. 26, 2005.

(30) Foreign Application Priority Data

Dec. 28, 2004    (JP)   ............... 2004-382064
Sep. 7, 2005    (JP)   ............... 2005-258987

(51) Int. Cl.
     *H03H 7/01*     (2006.01)
(52) U.S. Cl. ...................... 333/182; 333/185
(58) Field of Classification Search ........... 333/182, 333/185
See application file for complete search history.

(56) References Cited

U.S. PATENT DOCUMENTS

| | | | |
|---|---|---|---|
| 4,563,659 A | * | 1/1986 | Sakamoto ............... 333/181 |
| 5,374,907 A | * | 12/1994 | Orita et al. .............. 333/181 |
| 5,959,846 A | | 9/1999 | Noguchi et al. |

(Continued)

FOREIGN PATENT DOCUMENTS

JP     57-162508 A     10/1982

(Continued)

OTHER PUBLICATIONS

Official communication issued in counterpart European Application No. 05820336.5, mailed on Feb. 13, 2008.

(Continued)

*Primary Examiner*—Benny Lee
(74) *Attorney, Agent, or Firm*—Keating & Bennett, LLP (57) ABSTRACT

In a noise filter, an input side of a signal-line lead is inserted in a first substantially cylindrical ferrite bead, and an output side of the signal-line lead is inserted in a second substantially cylindrical ferrite bead. An input side of a ground lead is inserted in a third substantially cylindrical ferrite bead. The signal-line lead is inserted in a feedthrough capacitor such that the feedthrough capacitor is adjacent to an output side of the second substantially cylindrical ferrite bead. A multilayer capacitor is electrically coupled between the signal-line lead and the ground lead such that the multilayer capacitor is adjacent to an output side of the first substantially cylindrical ferrite bead and adjacent to an output side of the third substantially cylindrical ferrite bead. Each of an end of the signal-line lead and an end of the ground lead is flat, bent along an outer surface of a base member, and defines a surface-mount external terminal.

16 Claims, 7 Drawing Sheets

U.S. PATENT DOCUMENTS

| | | |
|---|---|---|
| 6,356,179 B1 | 3/2002 | Yamada |
| 6,791,445 B2 | 9/2004 | Shibata et al. |
| 6,940,387 B2 | 9/2005 | Shibata et al. |
| 2004/0174239 A1 | 9/2004 | Shibata et al. |

FOREIGN PATENT DOCUMENTS

| | | |
|---|---|---|
| JP | 59-22514 U | 2/1984 |
| JP | 60-170315 A | 9/1985 |
| JP | 1-22258 Y2 | 6/1989 |
| JP | 1-142213 U | 9/1989 |
| JP | 2-18587 Y2 | 5/1990 |
| JP | 4-281608 A | 10/1992 |
| JP | 4-369910 A | 12/1992 |
| JP | 06-096956 A | 4/1994 |
| JP | 6-31777 Y2 | 8/1994 |
| JP | 10-242339 A | 9/1998 |
| JP | 2000-164431 A | 6/2000 |
| JP | 2001-052934 A | 2/2001 |
| JP | 2002-158555 A | 5/2002 |
| JP | 2002-324714 A | 11/2002 |

OTHER PUBLICATIONS

Official Communication for PCT Application No. PCT/JP2005/023744; mailed Apr. 4, 2006.
Official communication issued in the counterpart Japanese Application No. 2005-258987, mailed on Apr. 4, 2006.
Official communication issued in counterpart Korean Application No. 10-2007-7013898, mailed on Jul. 29, 2008.
Official communication issued in counterpart Chinese Application No. 200580044602.6, mailed on Mar. 20, 2009.

* cited by examiner

NOISE FILTER HAVING FILTER COMPONENTS FITTED INTO DEPRESSIONS IN A BASE MEMBER

BACKGROUND OF THE INVENTION

1. Field of the Invention

The present invention relates to noise filters and, in particular, to a noise filter that includes a capacitor.

2. Description of the Related Art

In various types of controlling devices and electronic devices, in order to reduce noise coming through power lines, the incoming noise is filtered out by use of, for example, a noise filter inserted between the power lines.

Figure 16:
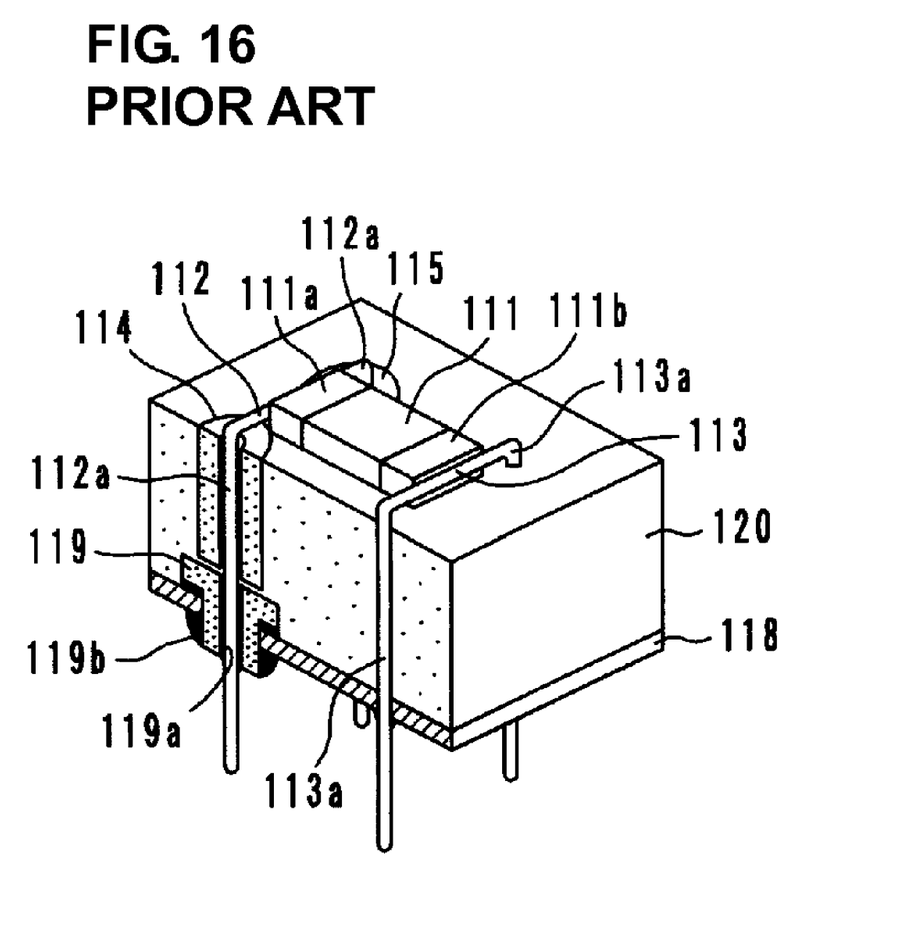
FIG. 16 is a fragmentary perspective view of a known noise filter.

Such noise filters are described in Patent Documents 1 to 4 (Patent Document 1: Japanese Examined Utility Model Registration Application Publication No. 1-22258; Patent Document 2: Japanese Unexamined Utility Model Registration Application Publication No. 59-22514; Patent Document 3: Japanese Examined Utility Model Registration Application Publication No. 2-18587; Patent Document 4: Japanese Examined Utility Model Registration Application Publication No. 6-31777). For example, a noise filter described in Patent Document 1 includes a multilayer capacitor 111, leads 112 and 113, cylindrical ferrite beads 114 and 115, a ground plate 118, and a feedthrough capacitor 119, as illustrated in FIG. 16.

The leads 112 and 113 are substantially U shaped. At the substantially central portion thereof, electrodes 111a and 111b of the multilayer capacitor 111 are soldered. Both first and second feet 112a of the lead 112 are inserted in the cylindrical ferrite beads 114 and 115. The lead 112 functions as a signal-line lead. The first foot 112a of the lead 112 is inserted in the feedthrough capacitor 119, in addition to the cylindrical ferrite bead 114.

The feedthrough capacitor 119, the second foot 112a of the lead 112, and both first and second feet 113a of the lead 113 pass through holes in the ground plate 118. The outer portions of the cylindrical ferrite beads 114 and 115 are fixed above the ground plate 118 by molding with an insulating resin 120.

The second foot 112a of the lead 112 is insulated from the ground plate 118. The first foot 112a of the lead 112 is soldered to an inner electrode 119a of the feedthrough capacitor 119. An outer electrode 119b of the feedthrough capacitor 119 is soldered to the ground plate 118.

Both of the first and second feet 113a of the lead 113, which functions as a ground lead, are soldered to the ground plate 118. The first foot 112a of the lead 112 and the first foot 113a of the lead 113 function as a pair of, for example, input terminals of the signal-line lead and the ground lead, respectively. The second foot 112a of the lead 112 and the second foot 113a of the lead 113 function as a pair of, for example, output terminals of the signal-line lead and the ground lead, respectively.

The noise filter is a footed discrete type in which the noise filter is implemented in a printed circuit board or the like by insertion of the feet 112a of the lead 112 and the feet 113a of the lead 113 in through holes of the printed circuit board. That is, all the noise filters described in Patent Documents 1 to 4 are the footed discrete type. Therefore, these noise filters cannot be used as a surface-mount component, which meets the future demands of the market.

SUMMARY OF THE INVENTION

In order to overcome the problems described above, preferred embodiments of the present invention provide a surface-mountable noise filter having a reduced profile and that is efficiently manufactured.

According to a first preferred embodiment of the present invention, a noise filter includes a base member, a signal-line lead, a ground lead, a substantially cylindrical ferrite bead in which the signal-line lead is inserted, a feedthrough capacitor in which the signal-line lead is inserted, the feedthrough capacitor being adjacent to an output side of the substantially cylindrical ferrite bead, and a capacitor electrically coupled between the signal-line lead and the ground lead, the capacitor being adjacent to an input side of the substantially cylindrical ferrite bead. Each of an end of the signal-line lead and an end of the ground lead is flat, bent along an outer surface of the base member, and defines an external terminal that projects beyond a bottom of the base member.

According to a second preferred embodiment of the present invention, a noise filter includes a base member, a signal-line lead, a ground lead, a substantially cylindrical ferrite bead in which the signal-line lead is inserted, a feedthrough capacitor in which the signal-line lead is inserted, the feedthrough capacitor being adjacent to an output side of the substantially cylindrical ferrite bead, and a capacitor electrically coupled between the signal-line lead and the ground lead, the capacitor being adjacent to an input side of the substantially cylindrical ferrite bead. The base member has a depression arranged to accommodate the substantially cylindrical ferrite bead and a depression arranged to accommodate the feedthrough capacitor. The depths of the depressions are set so that, in an accommodated state, an axis of a through hole of the substantially cylindrical ferrite bead and an axis of a through hole of the feedthrough capacitor are coplanar above the base member. Each of an end of the signal-line lead and an end of the ground lead is flat, bent along an outer surface of the base member, and defines an external terminal.

The substantially cylindrical ferrite bead, the feedthrough capacitor, and the capacitor may be coated with wax or other suitable material, and may be fixed to the base member, the signal-line lead, and the ground lead. The noise filter may further include a top cover arranged to cover the base member.

According to the first and second preferred embodiments of the present invention, since each of the ends of the signal-line lead and the ground lead is flat, bent along the outer surface of the base member, and defines a surface-mount external terminal, the noise filter is surface-mountable. In addition, since the external terminals project beyond the bottom of the base member, the noise filter is prevented from rattling when the noise filter is surface-mounted on a printed circuit board or the like. Therefore, the noise filter can be mounted in a stable state.

Furthermore, since the substantially cylindrical ferrite bead, the feedthrough capacitor, and the capacitor accommodated in the depressions of the base member are horizontally arranged, the profile of the noise filter can be reduced. In addition, since the depths of the depressions of the base member are set such that the axis of the through hole of the substantially cylindrical ferrite bead and the axis of the through hole of the feedthrough capacitor are coplanar above the base member, the noise filter can be efficiently assembled.

When the substantially cylindrical ferrite bead, the feedthrough capacitor, and the capacitor are coated with wax or other suitable material, inner components, including the feedthrough capacitor and the capacitor, can be prevented from absorbing moisture. Therefore, the noise filter is highly reliable.

Other features, elements, steps, characteristics and advantages of the present invention will be described below with reference to preferred embodiments thereof and the attached drawings.

BRIEF DESCRIPTION OF THE DRAWINGS

FIGS. 1A and 1B show a manufacturing process of a noise filter according to a first preferred embodiment of the present invention.

DETAILED DESCRIPTION OF PREFERRED EMBODIMENTS

Preferred embodiments of a noise filter and a manufacturing method therefor are described below with reference to the accompanying drawings, where the same reference number appearing in the different drawing figure denotes like features, and which may not be described in detail in every drawing figure in which they appear.

First Preferred Embodiment

Figure 8:
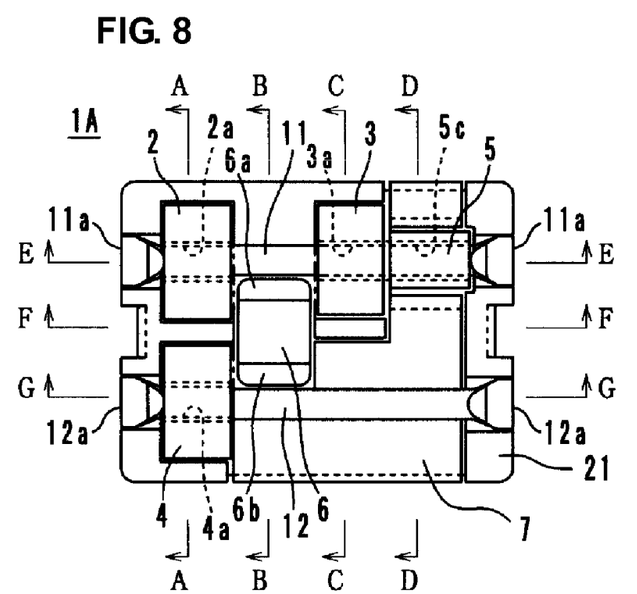
FIG. 8 is an internal plan view of the noise filter according to the first preferred embodiment of the present invention.
Figure 9A:
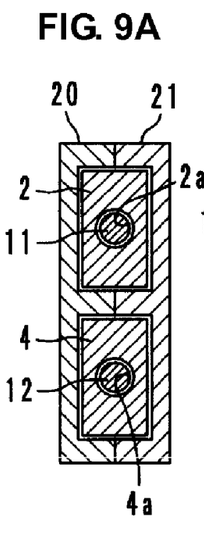
FIGS. 9A to 9D are cross-sectional views of the noise filter illustrated in FIG. 8 at several parts.
Figure 9B:
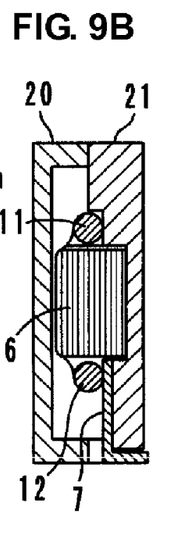
Figure 9C:
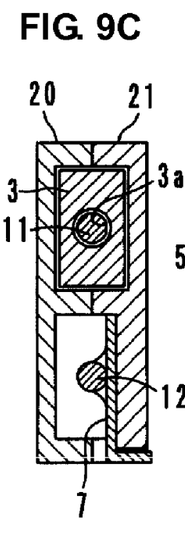
Figure 9D:
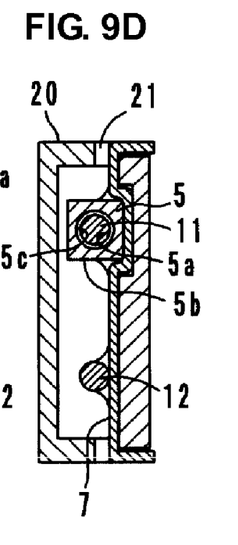

A noise filter 1A according to a first preferred embodiment, as shown in FIG. 8, is assembled in a manner described below. As illustrated in portion (I) of FIG. 1A and in FIG. 1B, a lead 11, which is cut into a predetermined length, is inserted into substantially cylindrical ferrite beads 2 and 3, and a feedthrough capacitor 5. Similarly, a lead 12, which is cut into a predetermined length, is inserted into a substantially cylindrical ferrite bead 4. Each of the leads 11 and 12 is, for example, a lead in which a copper wire of substantially circular cross section having a diameter of about 0.8 mm is dip-soldered. The leads 11 and 12 to which the components 2, 3, 4, and 5 are mounted are placed on a processing conveyer belt 30. The lead 11 is a signal-line lead. The lead 12 is a ground lead.

Figure 1A:
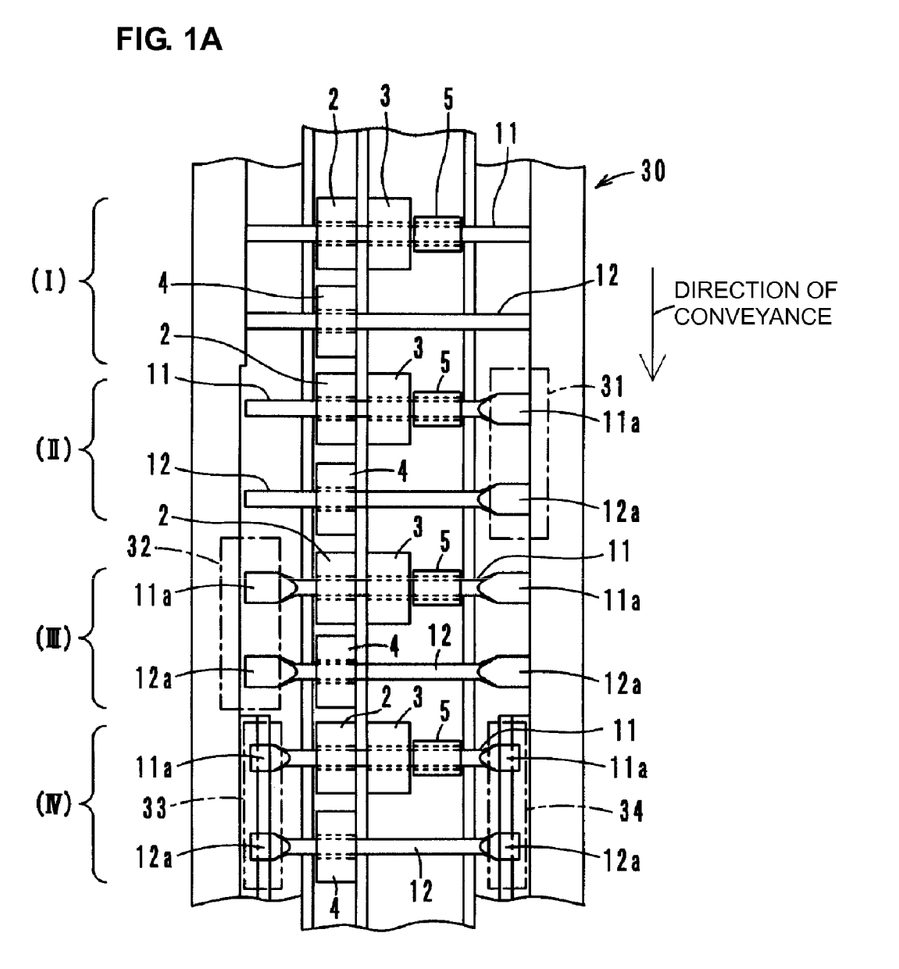
FIG. 1A is a plan view.

The leads 11 and 12 are conveyed by the processing conveyer belt 30, and, as illustrated in portion (II) of FIG. 1A, a first end 11a of the lead 11 and a first end 12a of the lead 12 are pressed and flattened by a press jig 31, which is indicated by the dot-dash line. Similarly, as illustrated in portion (III) of FIG. 1A, a second end 11a of the lead 11 and a second end 12a of the lead 12 are pressed and flattened by a press jig 32, which is indicated by the dot-dash line.

Figure 1B:
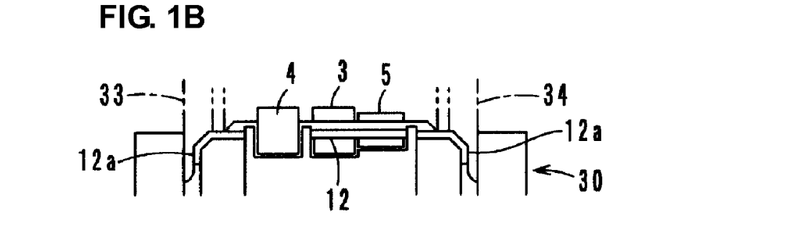
FIG. 1B is a front view of FIG. 1A.

As illustrated in portion (IV) of FIG. 1A and in FIG. 1B, both ends 11a of the lead 11 as shown in FIG. 1A and the both ends 12a of the lead 12 are preliminarily bent by press jigs 33 and 34, which are indicated by the dot-dash lines, respectively. Thereafter, the leads 11 and 12 are removed from the processing conveyer belt 30.

Figure 2:
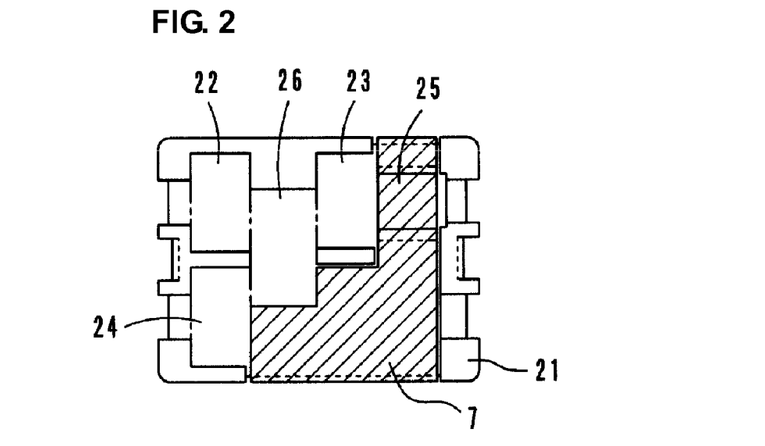
FIG. 2 is a plan view of a manufacturing process of the noise filter continued from FIGS. 1A and 1B.

Then, as illustrated in FIGS. 2 and 8, a base member 21 is provided. The base member 21 is preferably formed from insulating resin, such as PPS resin, for example. A ground plate 7 (shown by hatched lines in FIG. 2 and in FIGS. 4, 6, and 8) is mounted on the upper surface of the base member 21. The upper surface of the base member 21 is provided with depressions 22, 23, and 24 as shown in FIG. 2 arranged to accommodate the substantially cylindrical ferrite beads 2, 3, and 4, respectively, a depression 25 arranged to accommodate the feedthrough capacitor 5 (FIG. 15), and a depression 26 arranged to accommodate a multilayer capacitor 6 (which is described later).

Figure 3:
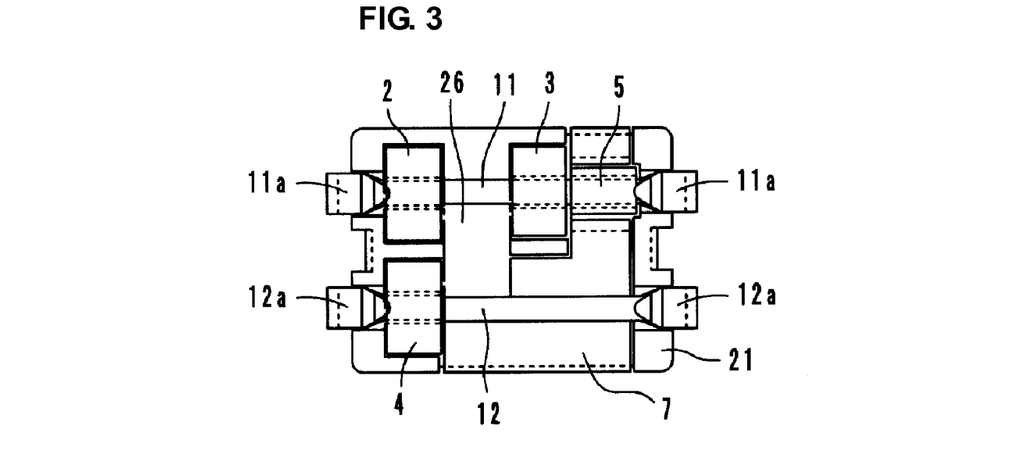
FIG. 3 is a plan view of a manufacturing process of the noise filter continued from FIG. 2.
Figure 4:
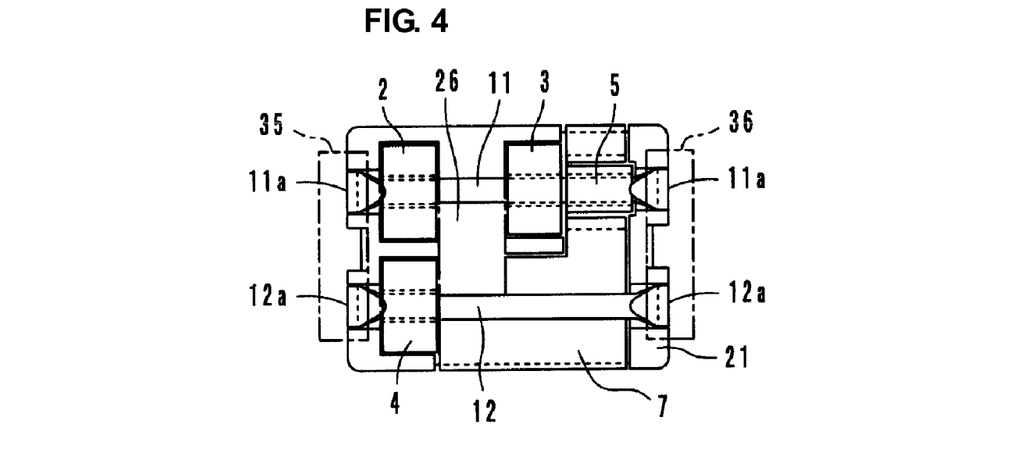
FIG. 4 is a plan view of a manufacturing process of the noise filter continued from FIG. 3.

Then, as illustrated in FIGS. 3 and 4, the leads 11 and 12 to which the components 2, 3, 4, and 5 are mounted are placed on the upper surface of the base member 21. The substantially cylindrical ferrite beads 2, 3, and 4 and the feedthrough capacitor 5 are accommodated in the depressions 22, 23, 24, and 25 (FIG. 2), respectively, and positioned. Thereafter, as illustrated in FIGS. 3, 4, 5, 6, and 8, both ends 11a of the lead 11 and both ends 12a of the lead 12 are bent along the outer surface of the base member 21 by press jigs 35 and 36, which are indicated by the dot-dash lines, respectively. Thus, the leads 11 and 12 are mounted to the base member 21 (see FIG. 15).

Figure 5:
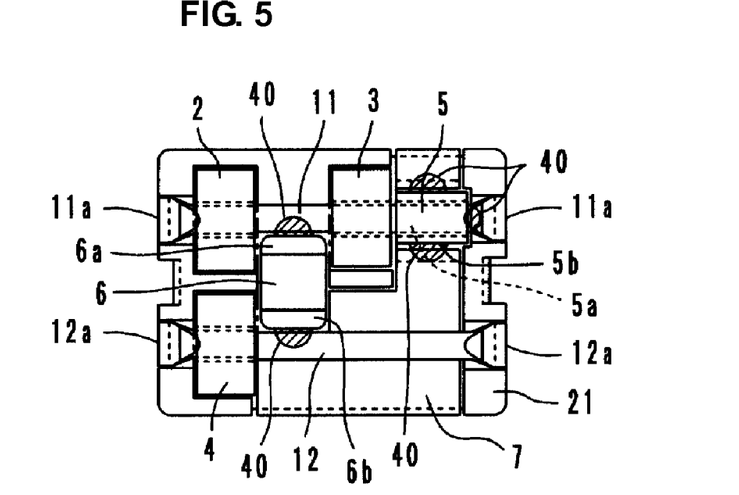
FIG. 5 is a plan view of a manufacturing process of the noise filter continued from FIG. 4.

Then, as illustrated in FIG. 5, the multilayer capacitor 6 is accommodated in the depression 26 (FIG. 4) of the base member 21 and positioned. Thereafter, the substantially cylindrical ferrite beads 2, 3, and 4, the feedthrough capacitor 5, and the multilayer capacitor 6 are coated with wax and are fixed to the base member 21 and the leads 11 and 12. Thus, the components 2, 3, 4, 5, and 6, which were not firmly fixed, are fixed to the base member 21 and the leads 11 and 12 with wax, and additionally, since the surfaces of the feedthrough capacitor 5 and the multilayer capacitor 6 are also wax coated, the feedthrough capacitor 5 and the multilayer capacitor 6 can be prevented from absorbing moisture. Therefore, the highly reliable noise filter can be obtained.

Then, with solder paste (hatched in FIG. 5), the lead 11 and a hot electrode 5a (FIG. 15) provided inside a through-hole of the feedthrough capacitor 5 are soldered together, and the ground plate 7 and a ground electrode 5b (FIG. 15) on the outer surface of the feedthrough capacitor 5 are soldered together. Furthermore, with the solder paste 40 (FIG. 5), a hot electrode 6a of the multilayer capacitor 6 is soldered to the lead 11 between the substantially cylindrical ferrite beads 2 and 3, and a ground electrode 6b (FIG. 8) of the multilayer capacitor 6 is soldered to the lead 12 behind the substantially cylindrical ferrite bead 4 and to the ground plate 7.

Figure 6:
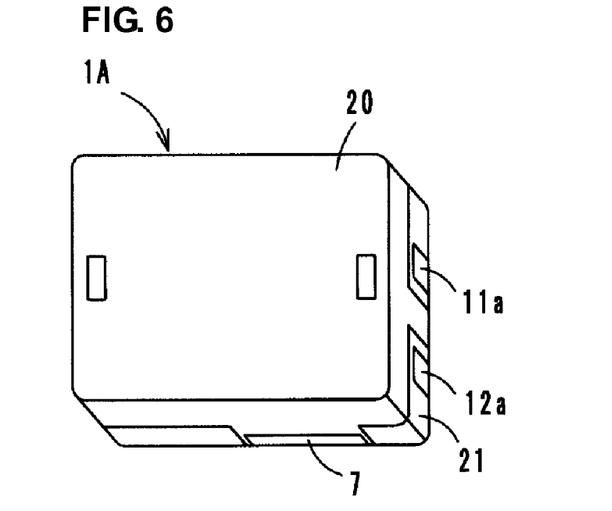
FIG. 6 is a perspective view of a manufacturing process of the noise filter continued from FIG. 5.
Figure 15:
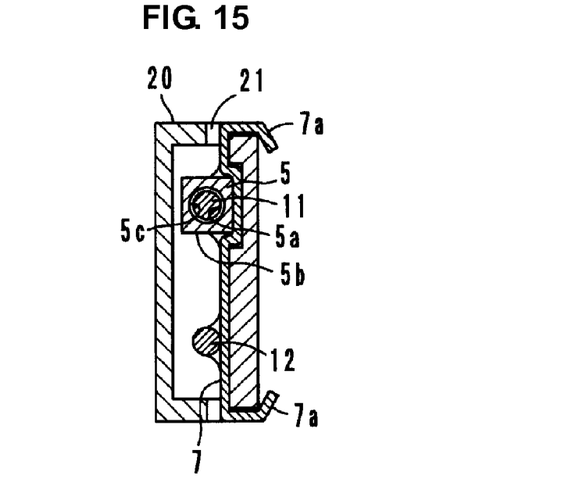
FIG. 15 is a cross-sectional view of a modification of the noise filter according to the first preferred embodiment of the present invention.

Then, as illustrated in FIGS. 6 and 15, a top cover 20 is fit over the base member 21 so as to cover the upper surface of the base member 21. The upper central surface of the top cover 20 is flat. By using suction on this portion supplied by a suction nozzle of an automatic implementing device, the noise filter 1A can be conveyed and mounted on a printed circuit board or the like.

Figure 7:
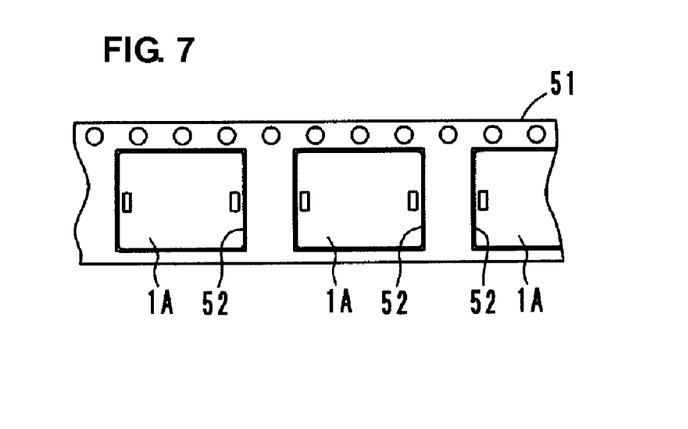
FIG. 7 is a plan view of a manufacturing process of the noise filter continued from FIG. 6.

After the noise filters 1A are manufactured, the noise filters 1A are accommodated in depressions 52 of a tape 51 and taped, as illustrated in FIG. 7.

In each of the manufactured noise filters 1A, as illustrated in FIG. 8, an input side of the signal-line lead 11 is inserted in the substantially cylindrical ferrite bead 2, and an output side of the signal-line lead 11 is inserted in the substantially cylindrical ferrite bead 3. An input side of the ground lead 12 is inserted in the substantially cylindrical ferrite bead 4. The signal-line lead 11 is inserted in the feedthrough capacitor 5 such that the feedthrough capacitor 5 is adjacent to an output side of the substantially cylindrical ferrite bead 3. The multilayer capacitor 6 is electrically coupled between the signal-line lead 11 and the ground lead 12 such that the multilayer capacitor 6 is adjacent to an output side of the substantially cylindrical ferrite bead 2 and adjacent to an output side of the substantially cylindrical ferrite bead 4.

Figure 10A:
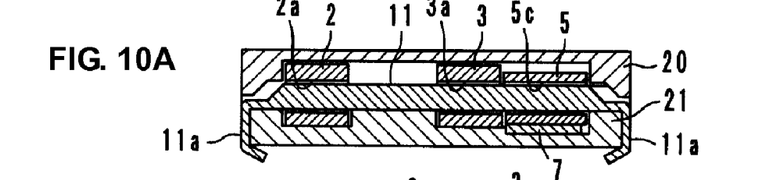
FIGS. 10A to 10C are cross-sectional views of the noise filter illustrated in FIG. 8 at several parts.
Figure 10B:
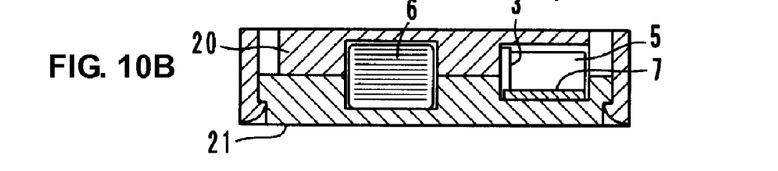
Figure 10C:
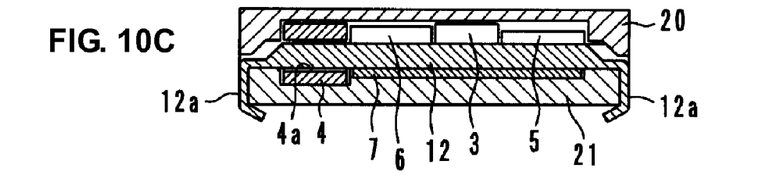
Figure 11:
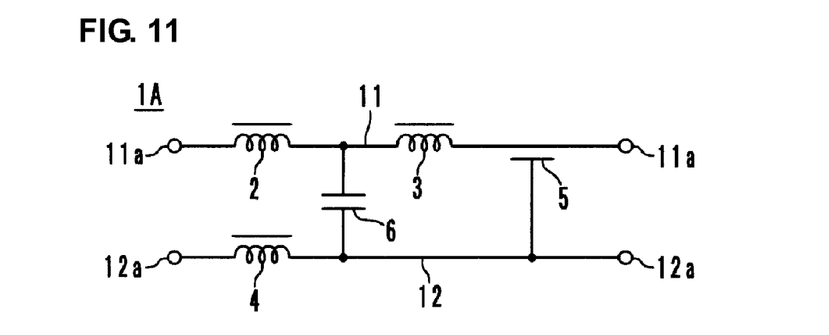
FIG. 11 is a schematic circuit diagram of an electrical equivalent circuit of the noise filter illustrated in FIG. 8.

FIGS. 9A, 9B, 9C, and 9D are cross-sectional views taken along positions A, B, C, and D in FIG. 8, respectively. FIGS. 10A, 10B, and 10C are cross-sectional views taken along positions E, F, and G in FIG. 8, respectively. As understood also from FIGS. 9A to 9D and 10A to 10C, the depths of the depressions 22, 23, 24, and 25 of the base member 21, as shown in FIG. 2, are set so that the axes of through holes 2a (FIGS. 8, 9A, and 10A), 3a (FIGS. 8, 9C and 10A), and 4a (FIGS. 8, 9A and 10C) of the substantially cylindrical ferrite beads 2, 3, and 4 and the axis of a through hole 5c (FIGS. 8, 9D, 10A, and 15) of the feedthrough capacitor 5 (FIGS. 9D, and 10A-10C) are coplanar above the base member 21. FIG. 11 is a schematic circuit diagram of an electrical equivalent circuit in the noise filter 1A including the signal-line lead 11 (with ends 11a), the ground lead 12 (with ends 12a), and the ferrite beads 2, 3, 4 and the capacitors 5, 6.

As shown in FIGS. 10A and 10C, in the noise filter 1A, each of the ends 11a of the lead 11 and the ends 12a of the lead 12 is flat and bent along the outer surface of the base member 21, and is formed as a surface-mount external terminal. Therefore, the noise filter 1A is surface-mountable.

In addition, since the depths of the depressions 22 to 25 of the base member 21 are set so that the axes of the through holes 2a to 4a of the substantially cylindrical ferrite beads 2 to 4 and the axis of the through hole 5c of the feedthrough capacitor 5 are coplanar above the base member 21, the components 2 to 5 can be easily mounted to the leads 11 and 12. Therefore, the noise filter 1A can be efficiently assembled.

Since the substantially cylindrical ferrite beads 2 to 4, the feedthrough capacitor 5, and the multilayer capacitor 6 accommodated in the depressions 22 to 26 of the base member 21 are horizontally arranged, the profile of the noise filter 1A can be reduced even more than that of a known noise filter illustrated in FIG. 16.

In addition, in the first preferred embodiment, as illustrated in FIGS. 9A to 9D and 10A to 10C, in a process of bending the external terminals 11a and 12a (ends of the leads 11 and 12), the ends 11a and 12a are projected beyond the bottom of the base member 21 by, for example, the provision of a gap between the bottom of the base member 21 and each of the ends 11a and 12a. Thus, the noise filter 1A can be surface-mounted on a printed circuit board or the like in a stable state without rattling.

In this case, preferably, solder paste may be applied to the ends 11a and 12a, and then the ends 11a and 12a may be heated and cooled on a plane to reflow the applied solder paste. This is because the reflowed solder, which has a flat surface, reduces non-flatness of the ends 11a and 12a, which project beyond the bottom of base member 21, and an increase in the quantity of solder used for soldering improves connection reliability of surface-mounting the noise filter 1A on the a printed circuit board or the like.

As illustrated in FIG. 15, external terminals 7a of the ground plate 7 may be bent substantially along the bottom of the base member 21. In this case, surface-mounting is further stabilized.

Second Preferred Embodiment

Figure 12:
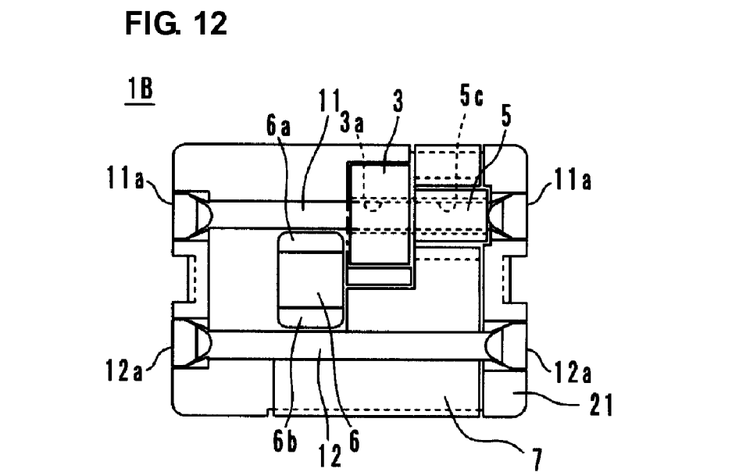
FIG. 12 is an internal plan view of a noise filter according to a second preferred embodiment of the present invention.
Figure 13:
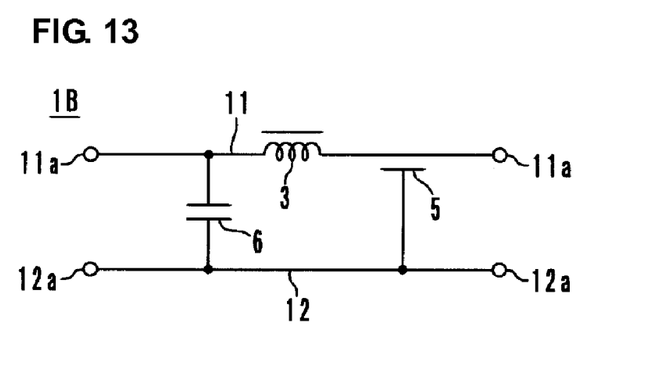
FIG. 13 is a schematic circuit diagram of an electrical equivalent circuit of the noise filter illustrated in FIG. 12.

As illustrated in FIG. 12, a noise filter 1B according to a second preferred embodiment is one in which the substantially cylindrical ferrite bead 2 and the substantially cylindrical ferrite bead 4 from the noise filter 1A according to the first preferred embodiment are removed. An electrical equivalent circuit in the noise filter 1B is shown in FIG. 13. Other structures are preferably substantially the same as those in the first preferred embodiment. In FIGS. 12 and 13, the same reference numerals are used as in the first preferred embodiment for similar members and portions, and the description thereof is not repeated here.

Third Preferred Embodiment

Figure 14:
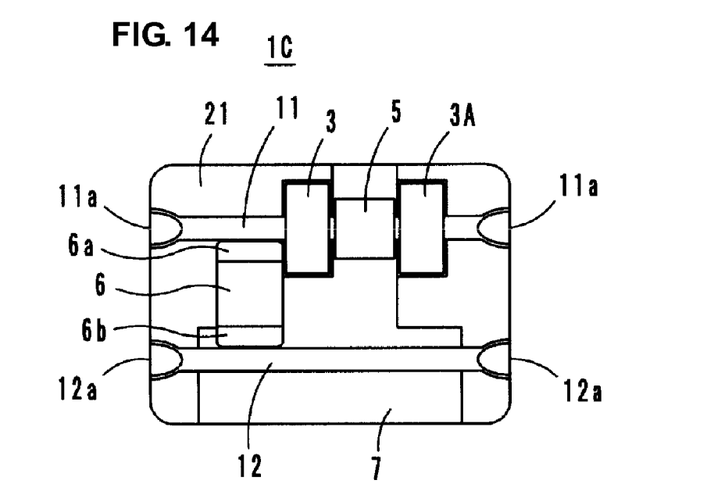
FIG. 14 is an internal plan view of a noise filter according to a third preferred embodiment of the present invention.

As illustrated in FIG. 14, a noise filter 1C according to a third preferred embodiment is one in which the noise filter 1B according to the second preferred embodiment further includes a substantially cylindrical ferrite bead 3A in which the signal-line lead 11 is inserted such that the substantially cylindrical ferrite bead 3A is adjacent to the output of the feedthrough capacitor 5. Other structures are substantially the same as those in the second preferred embodiment. In FIG. 14, the same reference numerals are used as in the second preferred embodiment for similar members and portions, and the description thereof is not repeated here. Compared with the second preferred embodiment, the third preferred embodiment has improved noise reduction characteristics at high frequency by the addition of the substantially cylindrical ferrite bead 3A. The noise filter according to the present invention is not limited to the preferred embodiments described above. Various modifications may be made without departing from the sprit or scope of the present invention.

For example, the ends 11a of the lead 11 and the ends 12a of the lead 12 may be flush with the bottom of the base member 21 without projecting beyond the bottom of the base member 21. The leads 11 and 12 may be substantially circular or may be substantially quadrilateral in cross section. Alternatively, the leads 11 and 12 may be flat shaped. The substantially cylindrical ferrite beads 2, 3, 3A, and 4 and the feedthrough capacitor 5 may be substantially circular or polygonal in cross section.

As described above, various preferred embodiments of the present invention are useful as a noise filter that includes a capacitor. In particular, various preferred embodiments of the present invention are advantageous in that a noise filter according to various preferred embodiments of the present invention is surface mountable in a stable state.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A noise filter comprising:
   a base member;
   a signal-line lead;
   a ground lead;
   a first substantially cylindrical ferrite bead in which an input-side of the signal-line lead is inserted;
   a second substantially cylindrical ferrite bead in which an output-side of the signal-line lead is inserted;
   a feedthrough capacitor in which the signal-line lead is inserted, the feedthrough capacitor being adjacent to an output side of the second substantially cylindrical ferrite bead;
   a capacitor electrically coupled between the signal-line lead and the ground lead, the capacitor being adjacent to an input side of one of the first and second substantially cylindrical ferrite beads; and
   a ground plate electrically coupled to the ground lead, the capacitor, and the feedthrough capacitor; wherein
   each of the signal-line lead and the ground lead has a substantially circular cross-section;
   the base member includes depressions arranged to accommodate each of the first and second substantially cylindrical ferrite beads and the feedthrough capacitor, a depth of each of the depressions is set so that, in an accommodated state, an axis of a through hole of each of the first and second substantially cylindrical ferrite beads and an axis of a through hole of the feedthrough capacitor are oriented coplanar to each other above the base member; and
   each of an end of the signal-line lead and an end of the ground lead is flat, bent along an outer surface of the base member, and defines an external terminal that projects beyond a bottom of the base member.

2. The noise filter according to claim 1, further comprising a top cover arranged to cover the base member.

3. The noise filter according to claim 1, wherein the first and second substantially cylindrical ferrite beads, the feedthrough capacitor, and the capacitor are coated with wax and are fixed to the base member, the signal-line lead, and the ground lead.

4. The noise filter according to claim 1, wherein the capacitor is a multilayer chip capacitor.

5. The noise filter according to claim 1, further comprising a third substantially cylindrical ferrite bead arranged such that the ground lead is inserted in the third substantially cylindrical ferrite bead.

6. The noise filter according to claim 5, wherein the capacitor is arranged between the signal-line lead and the ground lead, and between output sides of the first and third substantially cylindrical ferrite beads and an input side of the second substantially cylindrical ferrite bead.

7. The noise filter according to claim 5, wherein the capacitor is adjacent output sides of the first and third substantially cylindrical ferrite beads and an input side of the second substantially cylindrical ferrite bead.

8. The noise filter according to claim 5, wherein the base member further includes another depression arranged to accommodate the third substantially cylindrical ferrite bead.

9. A noise filter comprising:
   a base member;
   a signal-line lead;
   a ground lead;
   a first substantially cylindrical ferrite bead in which an input-side of the signal-line lead is inserted;
   a second substantially cylindrical ferrite bead in which an output-side of the signal-line lead is inserted;
   a feedthrough capacitor in which the signal-line lead is inserted, the feedthrough capacitor being adjacent to an output side of the second substantially cylindrical ferrite bead; and
   a capacitor electrically coupled between the signal-line lead and the ground lead, the capacitor being adjacent to an input side of one of the first and second substantially cylindrical ferrite beads; wherein
   each of the signal-line lead and the ground lead has a substantially circular cross-section;
   the base member includes depressions arranged to accommodate each of the first and second substantially cylindrical ferrite beads and the feedthrough capacitor, respective depths of the depressions are set so that, in an accommodated state, an axis of a through hole of each of the first and second substantially cylindrical ferrite beads and an axis of a through hole of the feedthrough capacitor are oriented coplanar to each other above the base member; and
   each of an end of the signal-line lead and an end of the ground lead is flat, bent along an outer surface of the base member, and defines an external terminal that projects beyond a bottom of the base member.

10. The noise filter according to claim 9, wherein the capacitor is a multilayer chip capacitor.

11. The noise filter according to claim 9, wherein the first and second substantially cylindrical ferrite beads, the feedthrough capacitor, and the capacitor are coated with wax and are fixed to the base member, the signal-line lead, and the ground lead.

12. The noise filter according to claim 9, further comprising a top cover arranged to cover the base member.

13. The noise filter according to claim 9, further comprising a third substantially cylindrical ferrite bead arranged such that the ground lead is inserted in the third substantially cylindrical ferrite bead.

14. The noise filter according to claim 13, wherein the base member further includes a depression arranged to accommodate the third substantially cylindrical ferrite bead.

15. The noise filter according to claim 13, wherein the capacitor is arranged between the signal-line lead and the ground lead, and between output sides of the first and third substantially cylindrical ferrite beads and an input side of the second substantially cylindrical ferrite bead.

16. The noise filter according to claim 13, wherein the capacitor is adjacent output sides of the first and third substantially cylindrical ferrite beads and an input side of the second substantially cylindrical ferrite bead.

* * * * *